United States Patent [19]
Motoda et al.

[11] Patent Number: 5,688,322
[45] Date of Patent: Nov. 18, 1997

[54] APPARATUS FOR COATING RESIST ON SUBSTRATE

[75] Inventors: Kimio Motoda; Kiyohisa Tateyama, both of Kumamoto; Noriyuki Anai, Kumamoto-ken, all of Japan

[73] Assignee: Tokyo Electron Limited, Tokyo, Japan

[21] Appl. No.: 653,341

[22] Filed: May 24, 1996

[30] Foreign Application Priority Data

May 24, 1995 [JP] Japan ................................. 7-149624

[51] Int. Cl.$^6$ ........................................................ B05C 5/00
[52] U.S. Cl. ........................... 118/52; 118/56; 118/319; 118/320; 118/500
[58] Field of Search ............................ 118/52, 56, 319, 118/320, 500

[56] References Cited

U.S. PATENT DOCUMENTS 5,415,691  5/1995  Fujiyama et al. ..................... 118/52
5,529,626  6/1996  Stewart .................................. 118/52

*Primary Examiner*—Laura Edwards
*Attorney, Agent, or Firm*—Oblon, Spivak, McClelland, Maier & Neustadt, P.C.

[57] ABSTRACT

Disclosed is an apparatus for coating resist comprising a spin-chuck capable of moving vertically, holding a substrate received and rotating together with the substrate, resist solution supplying mean for supplying a resist solution onto a substrate held on the spin-chuck, a rotating cup surrounding the substrate held on the spin-chuck and rotated in synchronism with the spin-chuck, for receiving the resist solution centrifugally separated from the substrate, a drain cup provided around the rotating cup, for receiving a waste material discharged from the rotating cup, the drain cup having a collecting space for collecting the waste material received, a drainage passage having a drainage port opening into the collecting space for discharging a liquid component of the waste material collected in the collecting space therefrom, an exhaust passage having an exhaust port communicating with the collecting space, for discharging a gas component of the waste material collected in the collecting space therefrom, an exhaust gas guiding passage provided at a level higher than at least the drainage port, for guiding the gas component from the collecting space to the exhaust passage, and a gas-liquid separating member provided in the exhaust gas guiding passage, for condensing a liquid component contained in air containing the gas component by striking it against the gas-liquid separating member, thereby preventing the liquid component from going around the exhaust passage.

16 Claims, 10 Drawing Sheets

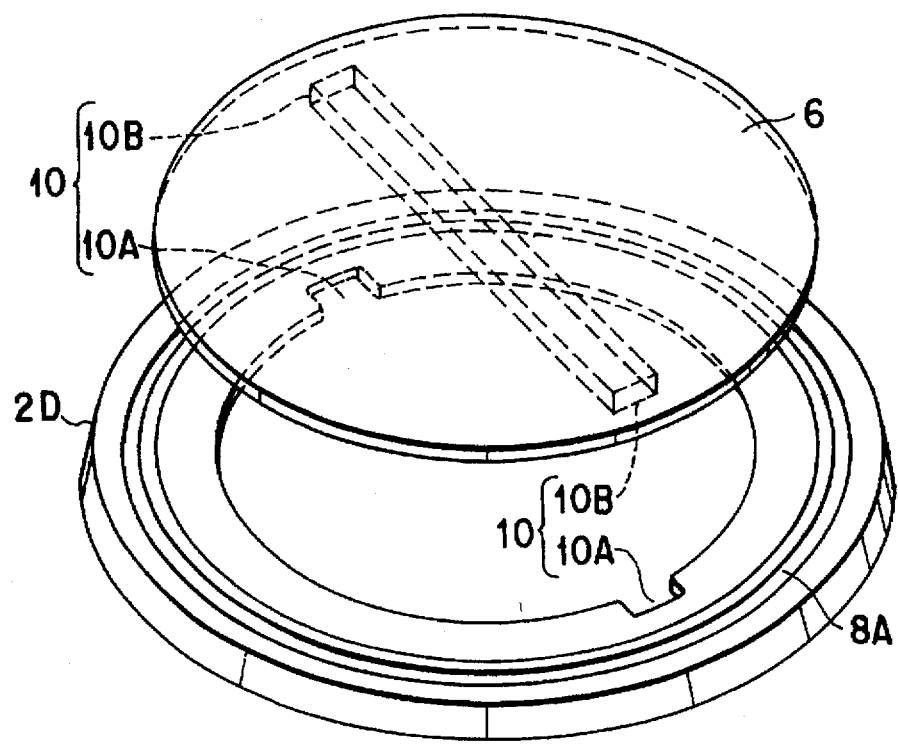
F I G. 10
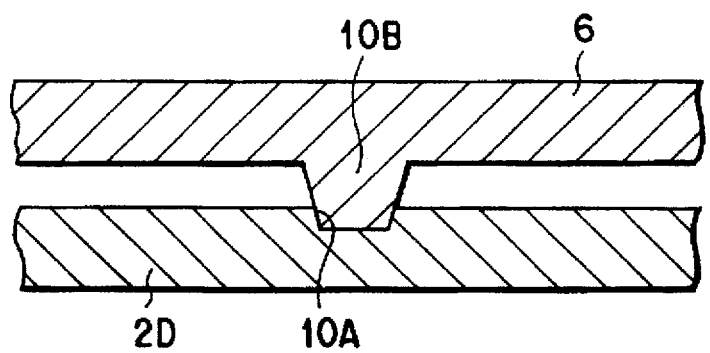
F I G. 11
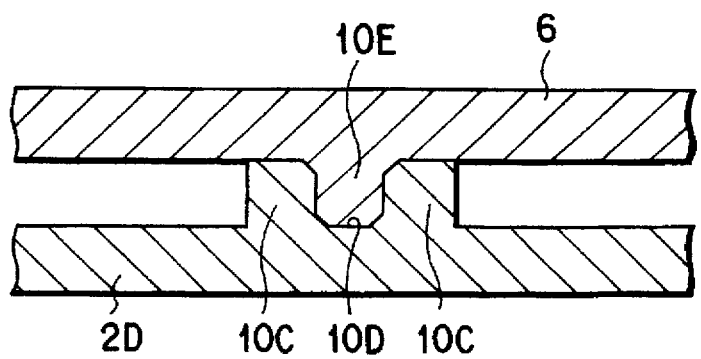
F I G. 12

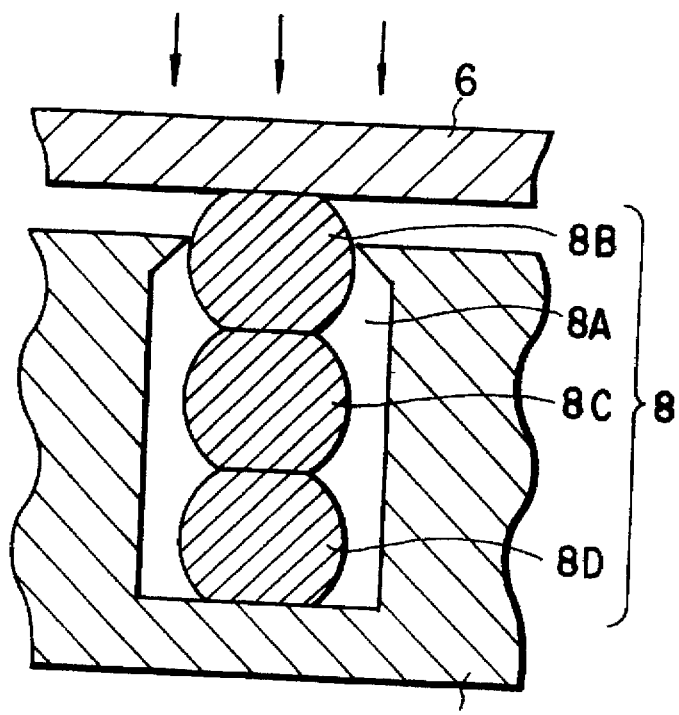
F I G. 16
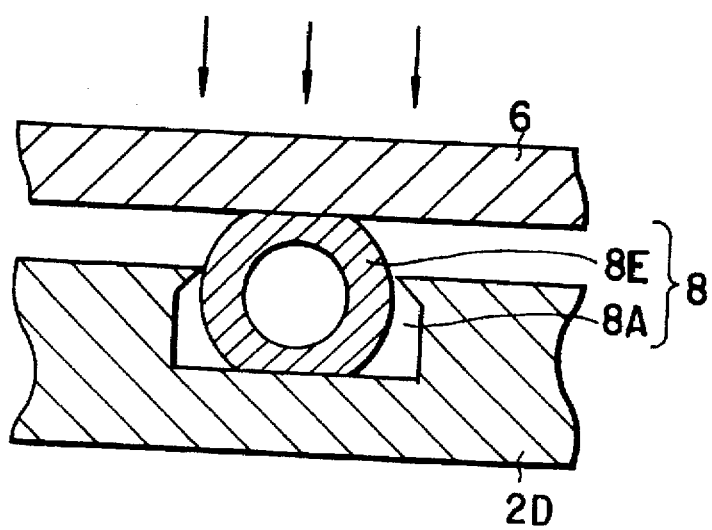
F I G. 17

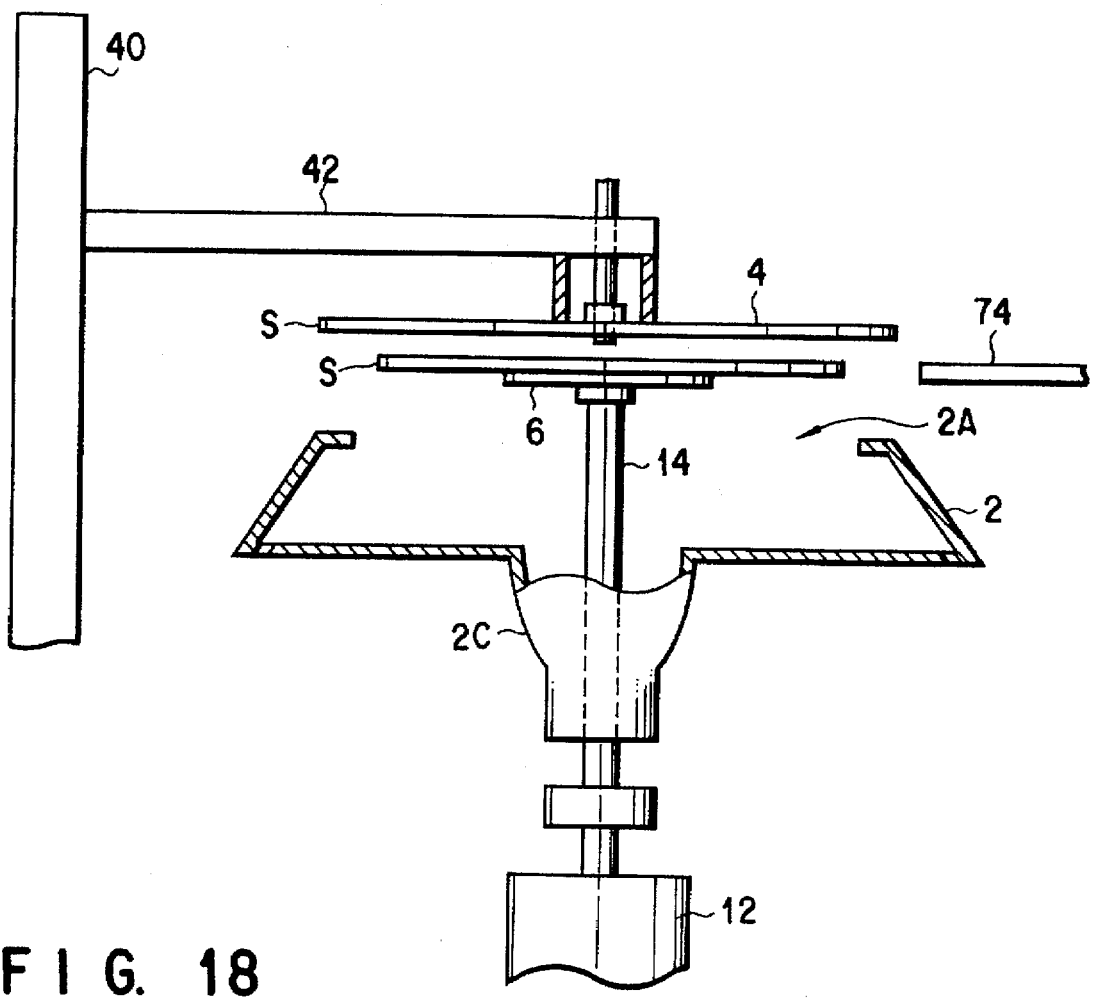
F I G. 18
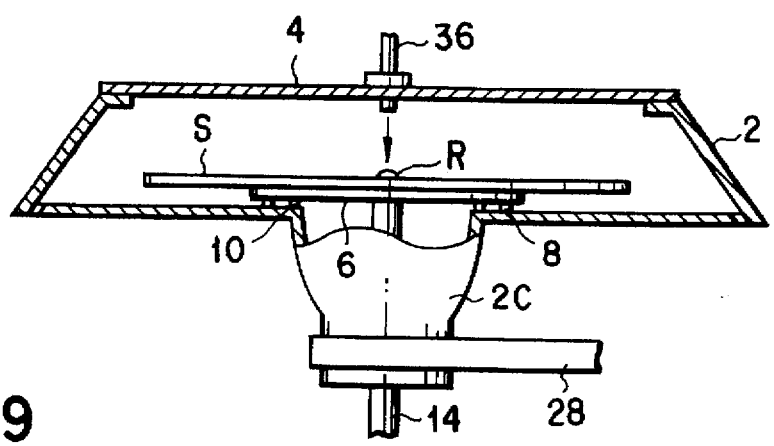
F I G. 19

APPARATUS FOR COATING RESIST ON SUBSTRATE

BACKGROUND OF THE INVENTION

1. Field of the Invention

The present invention relates to an apparatus for coating resist (resist coating apparatus) on a substrate such as a glass substrate for liquid crystal displays (LCD) or a semiconductor wafer.

2. Description of the Related Art

In an LCD manufacturing process, an ITO (indium tin oxide) thin-film electrode and a circuit pattern are formed by the same photolithographic technique as used in a process of manufacturing a semiconductor device. In the process, a glass substrate is washed, subjected to adhesion treatment, and cooled. After coated with a resist, the resultant substrate is baked, exposed to light, developed with a developing solution, rinsed and dried.

In applying resist to a substrate, a spin-coater is usually employed. More specifically, the substrate is mounted on the spin chuck of the spin-coater and a resist solution is poured dropwise on the substrate through an upper supply nozzle while the spin-coater is being rotated. Since the spin chuck and the substrate are surrounded by a rotating cup and a drain cup, a resist solution centrifugally separated from the substrate is received by the rotating cup and drain cup and ultimately discharged outside by way of a drainage passage. Owing to the construction, the periphery of the drain cup is not stained. To the drain cup, an exhaust passage is provided in addition to the drainage passage. The exhaust passage has an exhaust port located at a level higher than that of a drainage port. This makes it difficult for the mist-form drainage to go around the exhaust port.

The bottom of the rotating cup has an opening sealed liquidtight by a spin-chuck sealing portion. Since the opening is sealed, a rotating mechanism and a vertically movable mechanism located under the opening are successfully protected from resist-staining.

However, the conventional spin-coater as described above has the following problems.

First, with the course of time, a mist-form drainage gradually goes around the hill portion between the drainage port and the exhaust port. As a result, a portion around the exhaust port and the rear surface of the rotating cup are stained with liquid deposition.

Second, in the rotating means of the spin-chuck, a follower pulley and its belt are designed to be driven by a common driving shaft (or a common driving pulley). Hence, in theory, the spin-chuck and the rotating cup should be rotated in a synchronized manner. In practice, however, the rotating cup is rotated at a speed slightly different from the spin chuck. By the difference in a rotation speed, the rotation cup and spin-chuck are rubbed each other, damaging the sealing portion of the spin-chuck. Consequently, liquid leaks from the spin-chuck sealing portion, staining the rotating means and vertically movable means located under the sealing portion. In addition, a problem is posed in that particles resulting from the damage of the spin-chuck sealing portion are deposited on the resist film.

Third, in the conventional spin-chuck sealing portion 108 as shown in FIG. 14, the sealing between the rotation cup 102 and the spin-chuck 106 is ensured by inserting an O ring 108B into a trench 108A of the rotating cup 102 and pressing the O ring 108B by the spin-chuck 106. To achieve tighter sealing, it is necessary to increase the power of a vertically movable mechanism for pressing the O ring 108B. To do so, an apparatus of the conventional spin-coater will be inevitably enlarged. In particular, if O ring 108B is made of perfluoro (ethylene fluoride based resin), which is harder than other rubber materials, a high sealing performance cannot be attained unless high pressure is applied on the ring 108B.

SUMMARY OF THE INVENTION

An object of the present invention is to provide an apparatus for coating resist capable of preventing mist-form liquid of a drain cup from going around an exhaust port and capable of effectively removing stains attached to the drain cup resulting from the use over a long period of time.

Another object of the present invention is to provide an apparatus for coating resist capable of effectively preventing a difference in a rotation speed between a rotating cup and spin-chuck when operated.

Still another object of the present invention is to provide an apparatus for coating resist, with a high sealing performance between a rotating cup and a spin-chuck.

The apparatus for coating resist of the present invention comprises:

a spin-chuck capable of moving vertically, holding a substrate received and rotating together with the substrate;

resist solution supplying means for supplying a resist solution onto a substrate held on the spin-chuck;

a rotating cup surrounding the substrate held on the spin-chuck and rotated in synchronism with the spin-chuck, for receiving the resist solution centrifugally separated from the substrate;

a drain cup provided around the rotating cup, for receiving a waste material discharged from the rotating cup, the drain cup having a collecting space for collecting the waste material received;

a drainage passage having a drainage port opening into the collecting space, for discharging a liquid component of the wasting material collected in the collecting space therefrom;

an exhaust passage having an exhaust port communicating with the collecting space, for discharging a gas component of the waste material collected in the collecting space therefrom;

an exhaust gas guiding passage provided at a level higher than at least the drainage port, for guiding the gas component from the collecting space to the exhaust passage; and a gas-liquid separating member provided in the exhaust gas guiding passage, for condensing a liquid component contained in an air flow containing the gas component by striking it against the gas-liquid separating member, thereby preventing the liquid component from going around the exhaust passage.

The waste material collected in the collecting space of the drain cup includes contaminants such as fine particles and alkali ions, in addition to resist and its solvent. Most of the liquid component contained in the waste material is discharged through a drainage passage; however, part of them enters in the exhaust passage in the form of mist. The mist-form liquid strikes against the gas-liquid separating member in the exhaust gas guiding passage and then liquefied by condensation. The liquid component is therefore prevented from entering the gas-liquid separating member.

According to a second aspect of the present invention, the rotating cup and spin-chuck are connected with a lock mechanism interposed therebetween and are rotated synchronously. There is no difference in the rotation speed between the rotating cup and spin-chunk.

According to a third aspect of the present invention, a plurality of O ring members laid one on top of others are interposed between the rotating cup and spin-chuck. Sufficient sealing performance is thereby attained by low pressure application even if the O rings are made of a hard material.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 10 is a perspective view showing part of a spin-chuck and rotating cup having a lock mechanism;

FIG. 11 is an enlarged cross-sectional view showing a lock mechanism for connecting a rotating cup to a spin-chunk;

FIG. 12 is an enlarged cross-sectional view showing another lock mechanism for connecting a rotating cup to a spin-chunk;

FIG. 16 is an enlarged cross-sectional view showing a spin-chunk sealing portion according to another embodiment of the present invention;

FIG. 17 is an enlarged cross-sectional view showing a spin-chunk sealing portion according to another embodiment of the present invention;

FIG. 18 is a cross-sectional view, partially cut away, for explaining the operation of an apparatus for coating resist of the present invention; and FIG. 19 is a cross-sectional view, partially cut away, for explaining the operation of an apparatus for coating resist of the present invention.

DETAILED DESCRIPTION OF THE PREFERRED EMBODIMENTS

Hereinbelow, preferable embodiments of the present invention will be described with reference to the accompanying drawings.

Figure 1:
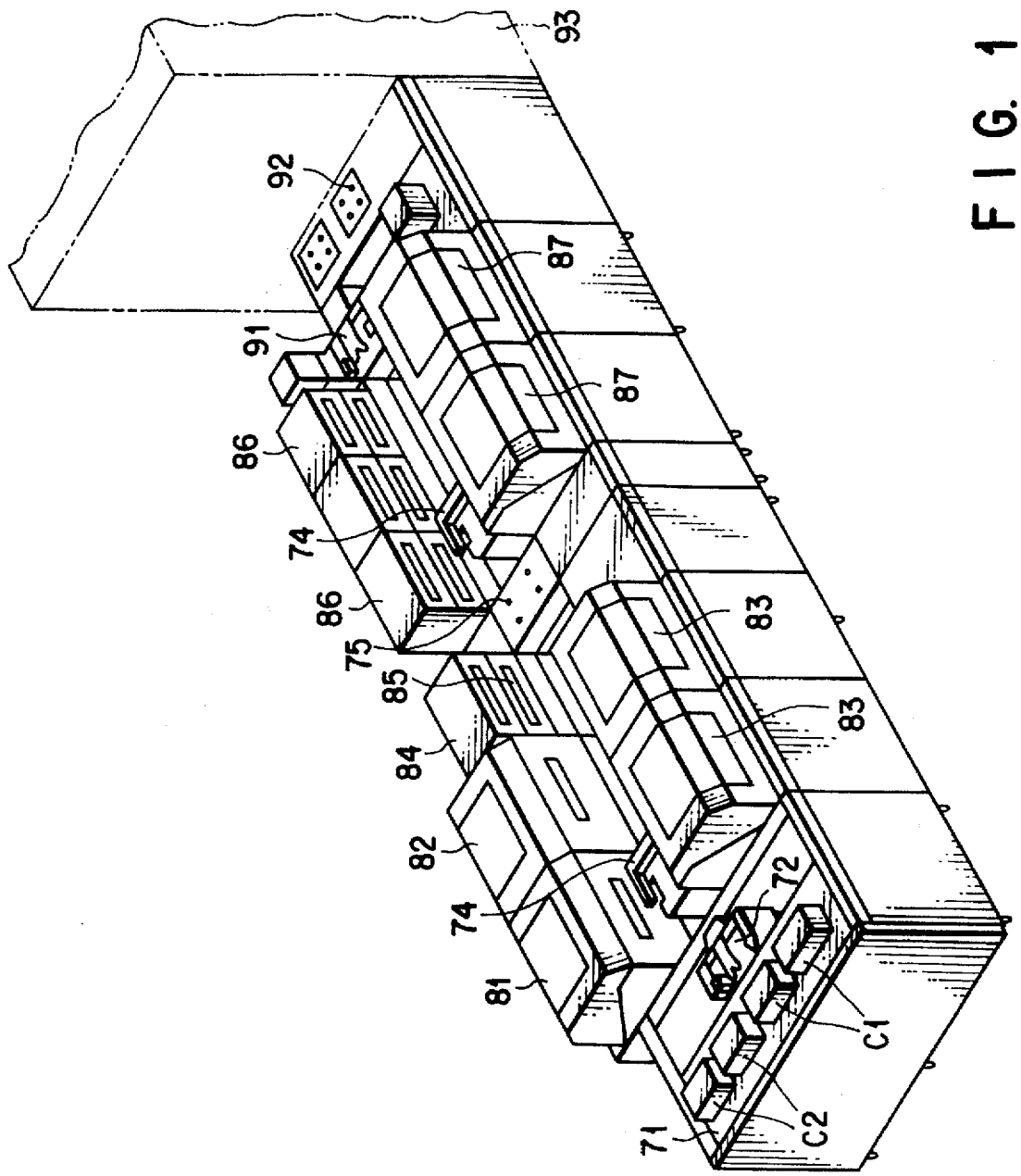
FIG. 1 is a perspective view schematically showing an entire resist treatment system for performing a resist treatment of an LCD substrate.

As shown in FIG. 1, a resist treatment system comprises a load/unload portion, two process portions and two interface portions. In the load/unload portion is provided a cassette stage 71 having a plurality of cassettes C1 and C2 disposed thereon. The cassette C1 accommodates a plurality of untreated glass substrates S and the cassette C2 houses a plurality of treated glass substrates S. Furthermore, on the load/unload portion, a forceps is provided for transferring substrate S.

In a first process portion, provided are a brush washing unit 81, jet-water washing unit 82 and two resist coating units 83, an adhesion unit 84 and a cooling unit 85. In a center passage of the first process portion 1, a main arm 74 is provided so as to be movable along the passage. A second process portion 75 is connected to the first process portion via a first interface portion having a delivery table 75. The second process portion has a plurality of heating units 86 and two developing units 87. Also in a center passage of the second process portion, a main arm 74 is provided so as to be movable along the passage.

Furthermore, the second process portion is connected to a light exposure device 93 via a second interface portion. The second interface portion has a forceps for transferring substrate S and a delivery table 92.

Figure 2:
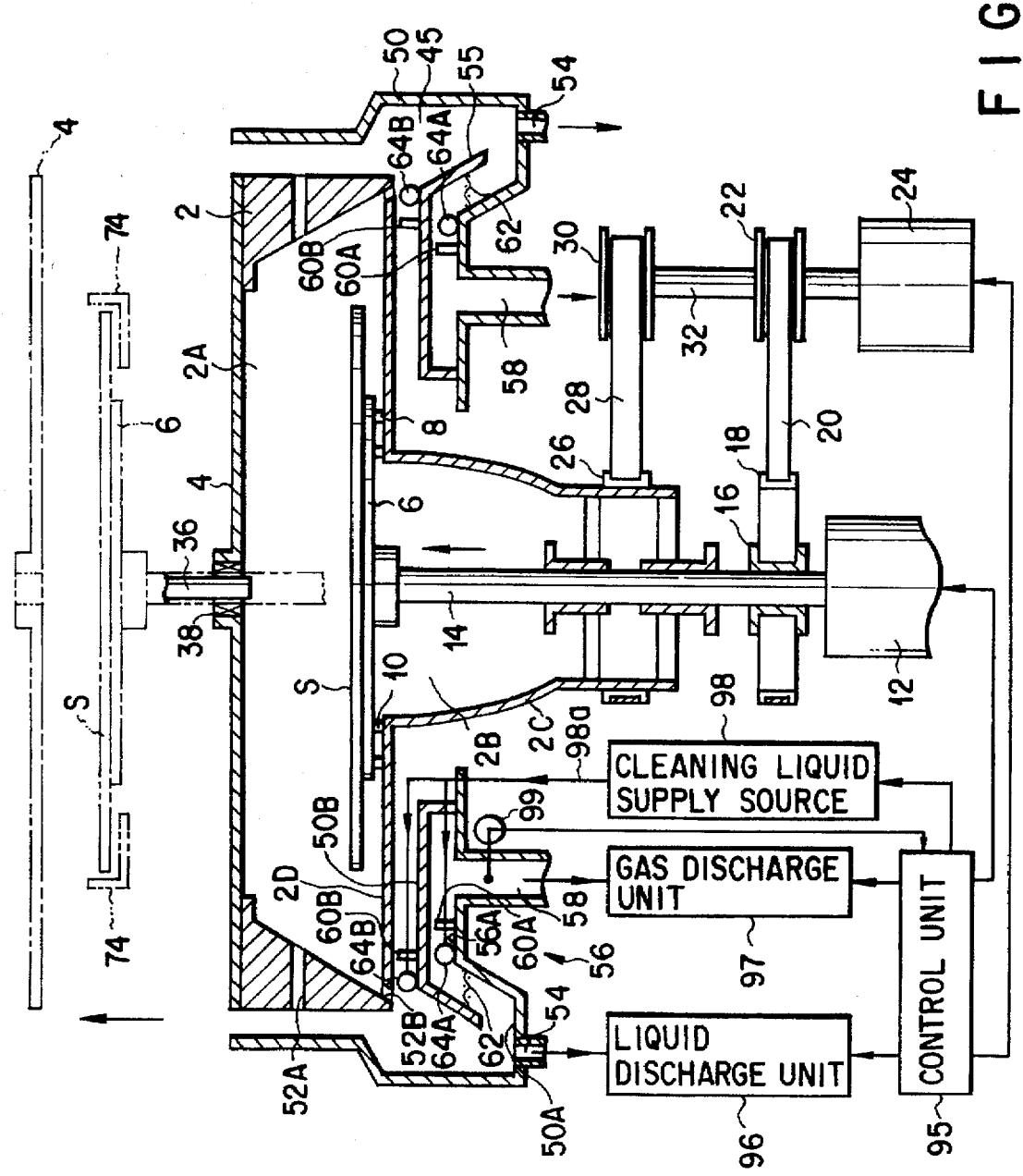
FIG. 2 is a cross-sectional block view showing an apparatus for coating resist according to an embodiment of the present invention.

In each of resist coating units 83, a resist coating apparatus shown in FIG. 2 is provided. The resist coating apparatus comprises a spin-chuck 6, a rotating cup 2, a drain cup 50, a drainage portion 96 and exhaust portion 97, a cleaning liquid supply source 98, and a control portion 95. Portions on the output side of the control portion 95 are individually connected to a driving portion 12 for elevating the spin chuck 6 and a driving portion 24 for rotating the spin chuck 6, and also connected to driving portions of the drainage portion 96, exhaust portion 97 and cleaning liquid supply source 98. These driving portions are individually controlled by the control portion 95.

The drain passage 54 of the drain cup 50 communicates with a pipe of the drainage portion 96. The exhaust passage 58 of the drain cup 50 also communicates with a duct of the exhaust portion 97.

Each of nozzles 64A and 64B communicates with a pipe 98a of the cleaning liquid supply source 98.

The rotating cup 2 is provided so as to be rotatable around a vertical axis by a driving mechanism. On the other hand, the spin-chuck 6 is provided so as to move around and along the vertical axis 14 by a driving mechanism. Under the rotating cup 2, a rotating collar 2C is provided. The vertical axis 14 of the spin-chuck 6 is passed through the rotating collar 2C and connected to the driving portion 12 for vertically movement at a lower end. Note that the driving portion 12 has an air cylinder.

Figure 3:
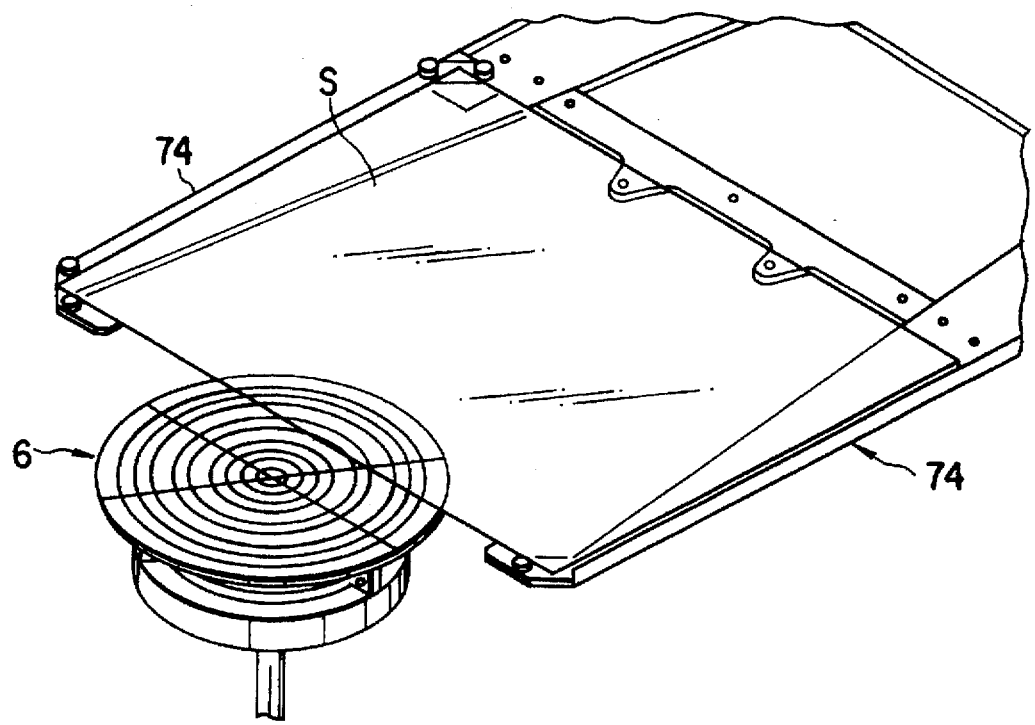
FIG. 3 is a perspective view showing a main arm and a spin-chuck for use in holding a glass substrate for LCD.

The spin-chuck 6 has an opening of a vacuum exhaust passage (not shown) in the upper surface of the spin chunk and serves to hold substrate S by adsorption. The vacuum exhaust passage of the spin-chunk 6 is formed within the vertical axis and communicates with a sucking port of a vacuum pump (not shown) set outside. As shown in FIG. 3, substrate S is transferred into the resist coating unit 83 by the main arm 74 and then mounted on the spin-chuck 6 by moving it upwardly.

In a center bottom portion of the rotating cup 2, an opening portion 2B is formed. To the peripheral edge of the opening portion, the upper peripheral edge of rotating collar 2C is connected. Onto the rotating cup 2, a cover 4 is provided so as to cover an upper opening 2A of the cup 2. According to this embodiment, the rotating cup 2 is rotated integrally with the cover 4.

Figure 8:
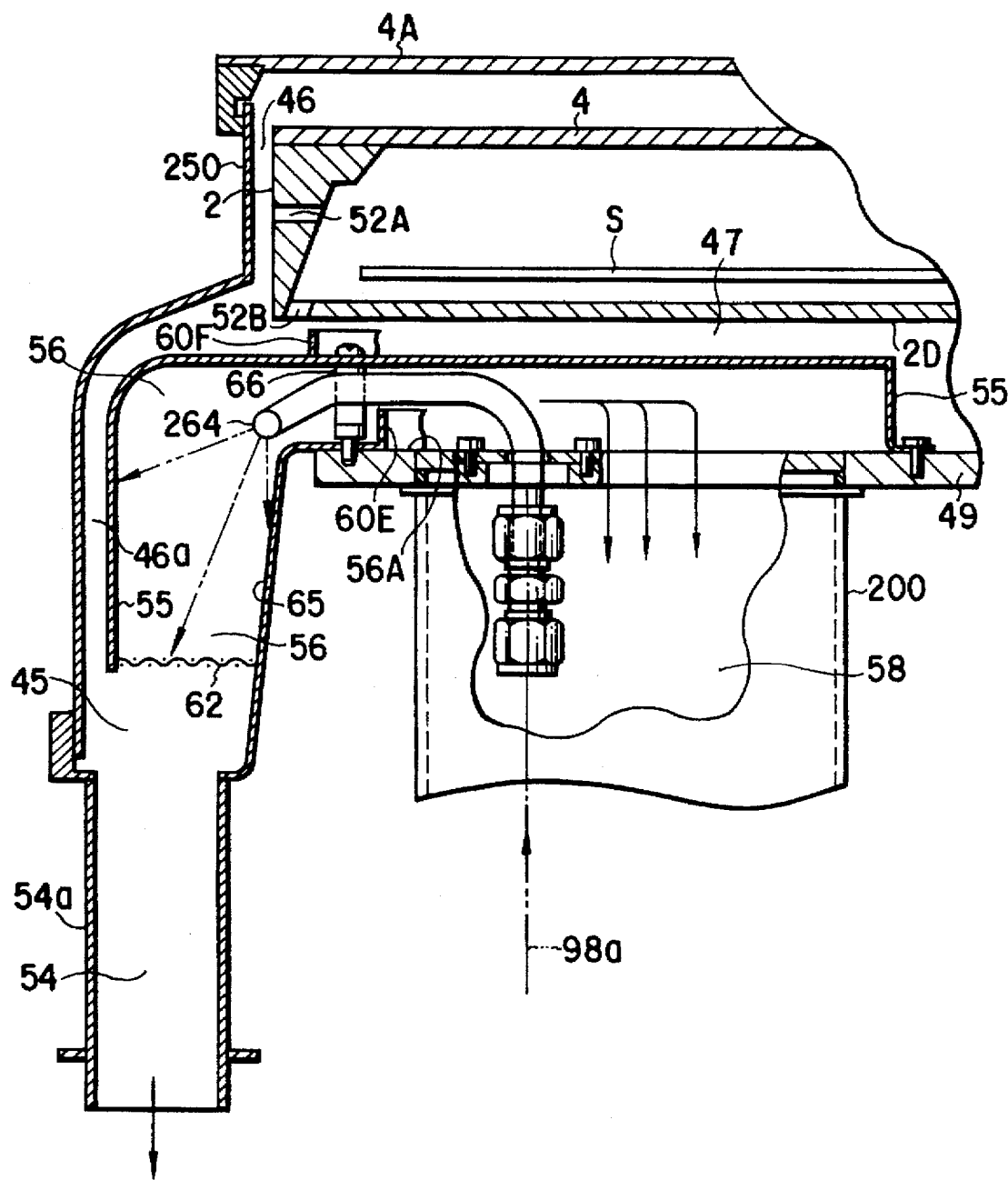
FIG. 8 is an enlarged cross-sectional view, partially cut away, and schematically showing another drain cup and rotating cup.
Figure 9:
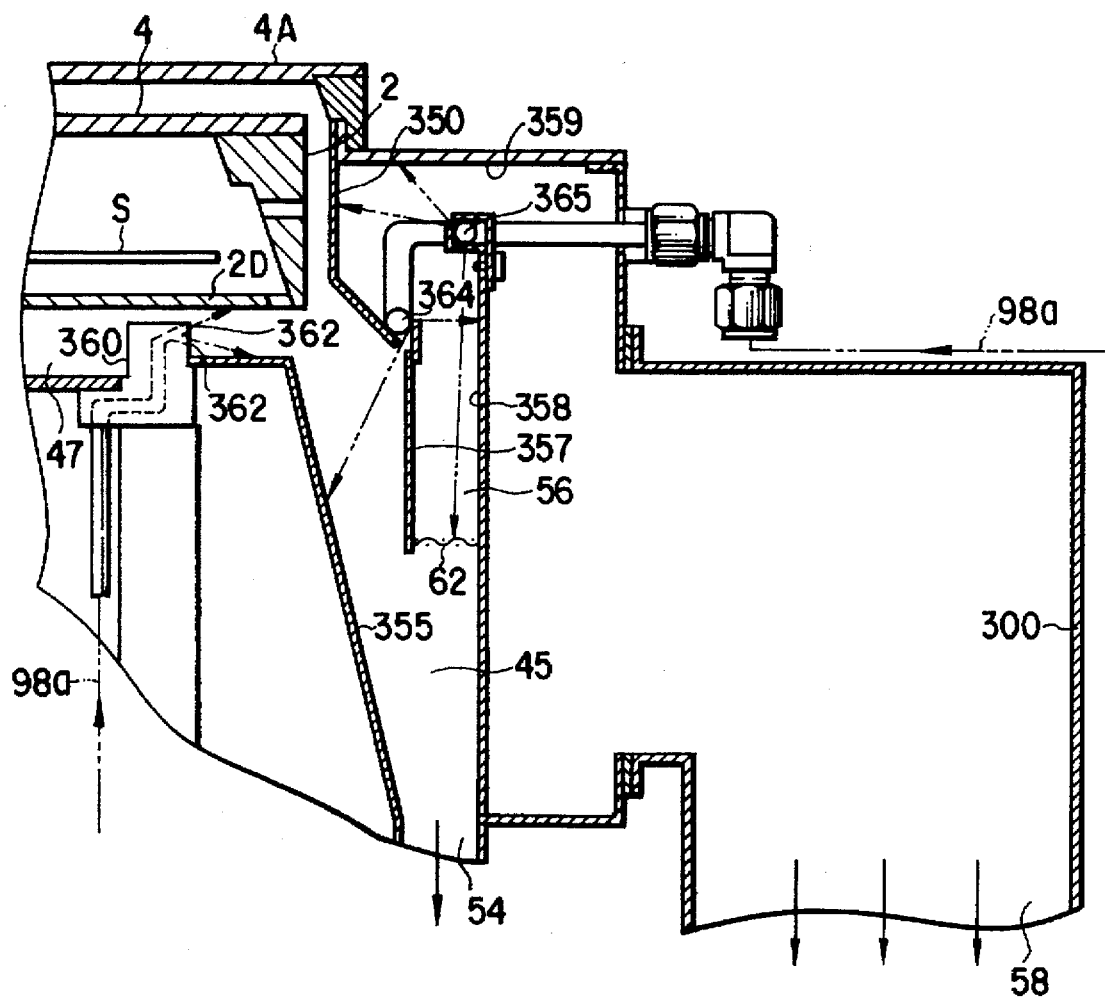
FIG. 9 is an enlarged cross-sectional view, partially cut away, and schematically showing still another drain cup and rotating cup.
Figure 13:
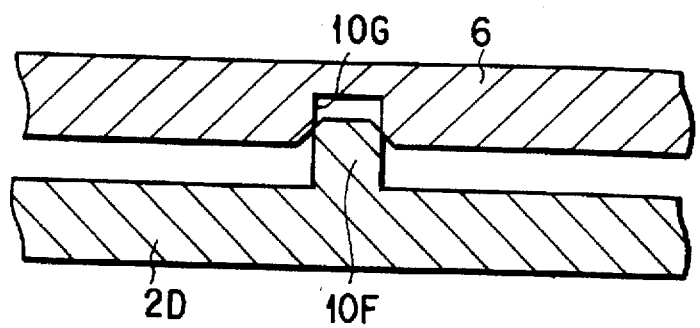
FIG. 13 is an enlarged cross-sectional view showing still another lock mechanism for connecting a rotating cup to a spin-chunk.

As show in FIG. 18, the cover 4 is supported by an arm 42 of the vertically movable mechanism 40 so as to be movable up and down. When the rotating cup 2 is covered with the cover 4, a treatment space 2A is formed for coating substrate S with a resist solution. Furthermore, as shown in FIGS. 8 and 9, drain cups 50, 250 and 350 are covered with an outer cover 4A, which is supported by an arm (not shown) of the vertically movable mechanism so as to be movable up and down.

As shown in FIGS. 2 and 19, at a center portion of the cover 4, a nozzle 36 is provided via a bearing 38. The nozzle 36 communicates with a resist solution supply source (not shown) and is used for spraying the resist solution onto substrate S mounted on the spin-chuck 6. In the meantime, part of the nozzle 36 is fixed on the vertically movable arm 42.

The vertical axis 14, which is connected to a driving pulley 22 via a spline shaft 16, follower pulley 18 and driving belt 20, is rotated by a spin-motor 24. In the same manner, the rotating collar 2C is connected to a driving pulley 30 via the follower pulley 26 and driving belt 28. The driving pulleys 22 and 30 are provided to a common axis 32 and driven by a common spin motor 24. Accordingly, the spin-chuck 6 and a rotating cup 2 can be rotated in a synchronized manner.

Furthermore, between the upper surface of the bottom portion 2D of the rotating cup 2 and the lower surface of the spin-chuck 6, a sealing mechanism 8 is provided. The sealing mechanism 8 prevents to disorder a gas flow surrounding the spin chuck 6, and as a result an uniform thickness resin film on the substrate is obtained.

Hereinbelow, the rotating cup and drain cup will be explained in detail with reference to FIGS. 4 to 9.

A rotating cup 2 is provided so as to surround substrate S on a spin-chuck 6. A drain cup 50 is positioned so as to surround the rotating cup 2. The drain cup 50 is fixed onto the fixing member (not shown). In the outer peripheral surface of the rotating cup 2, a number of drainage holes 52A are provided. The resist solution centrifugally separated from substrate S is discharged from the treatment space 2A by way of the drainage holes 52A. To the bottom peripheral portion of the rotating cup 2, a number of drainage holes 52B are also provided. The resist solution centrifugally separated from substrate S is discharged from the treatment space 2A by way of the drainage holes 52B. The resist solution discharged from the treatment space 2A is collected in the lower space 45 and discharged from the drain cup 50 by way of a drain passage 54. The resist solution discharged usually contains a trace amount of contaminants such as particles and alkali ions other than resist and a solvent. The shape of drainage holes 52A and 52B may not always be a right circle and may be an ellipse or a slit form.

Between the vertical inner wall of the drain cup 50 and outer peripheral surface portion of the rotating cup 2, an upper clearance 46 is formed. It is preferable that the upper clearance 46 should not be formed excessively narrower in order to facilitate the waste liquid to flow down smoothly through the drainage holes 52.

The lower space 45 is defined by a vertical inner wall of the drain cup 50, an outer peripheral wall of an inner ring 55 and a bottom inner wall 50A. It is desirable that the lower space 45 be as large as possible within the allowable range in order to encourage the waste liquid through the drain passage 54 to flow down.

The inner ring 55 covers an opening of the exhaust passage 58. Between the inner ring 55 and a hill portion 56A of the drain cup 50, an exhaust gas guiding passage 56 is formed.

It should be noted that the opening portion of the drain passage 54 is positioned lower than the opening portion of the exhaust passage 58. In other words, at the bottom surface portion of the drain cup 50, the hill portion 56A is formed. The hill portion 56A is positioned higher than the inner bottom wall 50A. To describe using different expression, the exhaust gas guiding passage 56 is positioned higher than the opening portion of the drain passage 54.

Figure 4:
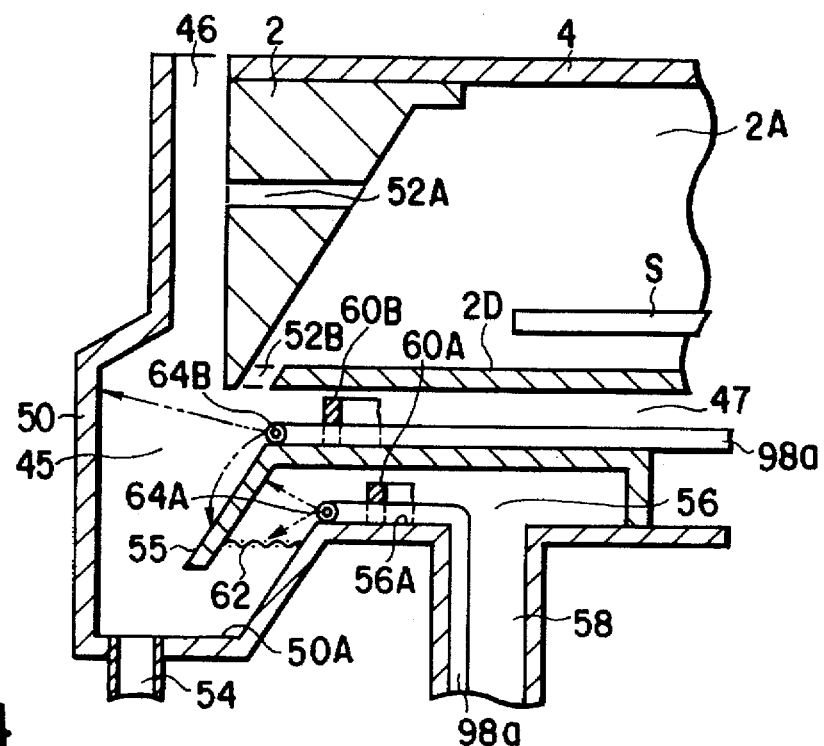
FIG. 4 is an enlarged cross-sectional view, partly cut away, and schematically showing a drain cup and rotating cup.

As shown in FIG. 4, in the entrance of the exhaust gas guiding passage 56 (the upstream-side opening), a filter 62 is provided. Mist guided into the exhaust passage 58 is separated into a gaseous component and a liquid component by the filter 62. The liquid component thus separated proceeds toward the drain passage 54 and is discharged therefrom, while the gaseous component proceeds toward the exhaust passage 58 and is discharged therefrom. As the filter 62, preferably used are a mesh filter formed of wire having a high corrosion resistance, such as a stainless steel, and a reticulate filter made of a punching metal, a resin fiber or the like. In the embodiments of the present invention, use is made of a wire mesh made of austenite series stainless steel.

On the hill portion 56A of the drain cup 50, a first nozzle 64A of a ring form and a barrier member 60A (gas-liquid separating member) are provided. The first nozzle 64A communicates with a cleaning liquid supply source 98 via a pipe 98a. In the cleaning liquid supply source 98, a solvent such as thinner is stored as a cleaning liquid. The spray port of the first nozzle 64A is directed to the entrance side of the exhaust gas guiding passage 56. From the first nozzle 64A, a cleaning liquid is sprayed onto the filter 62 and the inner wall of the inner ring 55. The barrier member 60A, which is provided on an appropriate place of the hill portion 56A, serves to condense and liquefy a mist air-flow by striking against the barrier member and to prevent a waste liquid from running up and depositing on the hill portion 56A.

Furthermore, clearance 47 is provided between an upper surface of the inner ring 55 and the lower bottom surface 2D of the rotating cup. In the clearance 47, the waste liquid is also run up and deposit on the upper surface of the inner ring 55. To prevent the deposition, a second nozzle 64B of a ring form and a barrier member 60B are provided in the clearance 47. The second nozzle 64B communicates with a cleaning liquid supply source 98 via a pipe 98a. The spray port of the second nozzle 64B is directed to the vertical inner wall of the drain cup 50 and to the outer surface of the inner ring 55.

Figure 5:
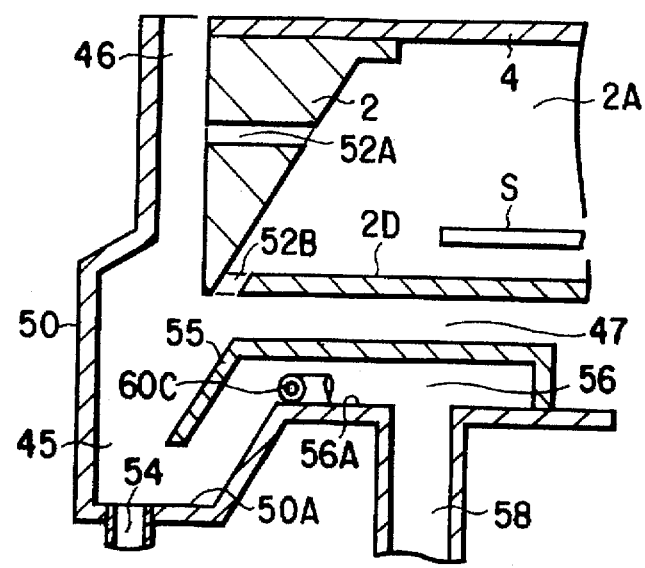
FIG. 5 is an enlarged cross-sectional view, partially cut away, and schematically showing another drain cup and rotating cup.
Figure 6:
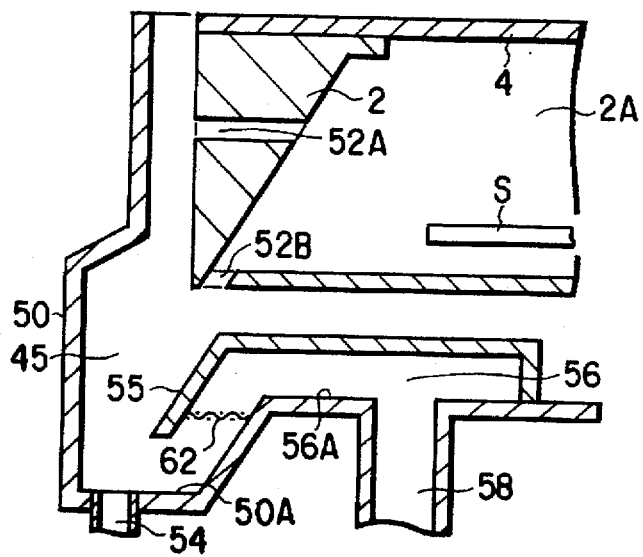
FIG. 6 is an enlarged cross-sectional view, partially cut away, and schematically showing another drain cup and rotating cup.
Figure 7:
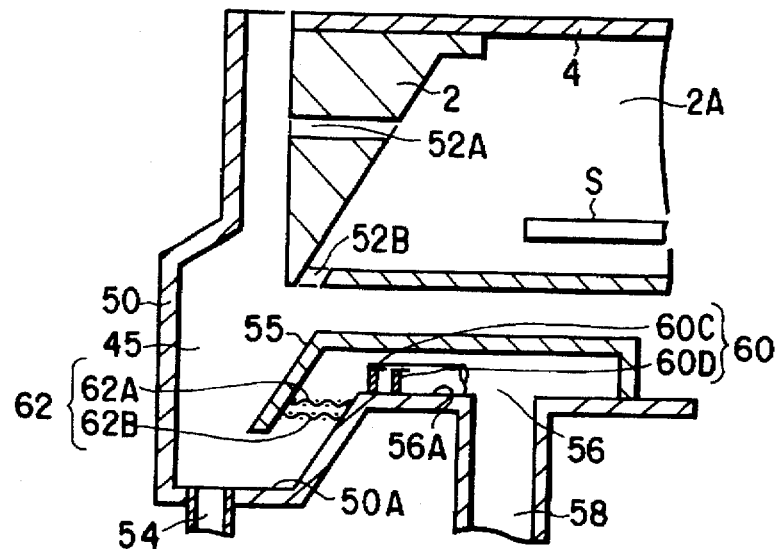
FIG. 7 is an enlarged cross-sectional view, partially cut away, and schematically showing another drain cup and rotating cup.

FIGS. 5 to 9 show apparatuses modified in various ways. As a gas-liquid separating member, a ring-form (or annular) pipe 60C may be provided on the hill 56A as shown in FIG. 5 and a filter 62 is solely provided at the entrance of the exhaust gas guiding passage 56 as shown in FIG. 6. Alternatively, dual filters 62A and 62B are provided at the entrance of the exhaust gas guiding passage 56 and simultaneously double ring barrier members 60C and 60D may be provided on the hill 56A as the gas-liquid separating member as shown in FIG. 7.

When the aforementioned apparatus is used for a long time, the filter 62 are often clogged by the attachment of dried resist solid, lowering an exhaust efficiency. In this case, using a nozzle 264, which is hanged by a support 66 in the exhaust gas guiding passage 56 so as not to touch the hill portion 56A, a cleaning liquid is directly sprayed onto the filter 62, as shown in FIG. 8. If so, the clogging of the filter 62 can be removed and thereby a desired exhaust efficiency can be obtained.

It is preferable that the nozzle 264 for washing a filter be operated at intervals of a predetermined time period, or operated regularly before or after predetermined lot numbers are treated. Alternatively, the nozzle 264 may be automatically operated by the steps of monitoring the exhaust gas volume by means of an on-line exhaust volume sensor 99 provided in the exhaust passage 58 (shown in FIG. 2), and driving it the nozzle 264 (64A) only when the exhaust gas volume decreases.

The exhaust efficiency can be further increased, if the exhaust passage is enlarged by increasing a diameter of a duct 200. Furthermore, if a first barrier member 60E is positioned at a posterior portion of the nozzle 264 (downstream side), it will be possible to prevent a liquid component running onto the hill portion 56E from entering into the exhaust passage 58. The first barrier member 60E is formed by bending an end portion of a pipe 54a (65) constituting a drain passage 54. A second barrier member 60F is disposed in a clearance 47.

The exhaust passage 58 may be enlarged by providing a large duct 300 on the outer side of a drain cup 350, as shown in FIG. 9. In addition, first and second nozzles 364 and 365 may be provided in the exhaust gas guiding space 56. From the first nozzle 364, a cleaning liquid is sprayed out onto each of an inner ring 355, vertically dividing wall 357 and filter 62. On the other hand, from the second nozzle 365, a cleaning liquid is sprayed out onto each of the vertical wall 357 of the drain cup and the inner ceiling wall 359. Furthermore, a third nozzle 360 may be provided in a clearance 47 to spray a cleaning liquid from a spray port 362 to the lower bottom surface 2D of the rotating cup and to the upper surface of the inner ring 355.

Hereinbelow, the lock mechanism connecting the rotating cup and the spin-chuck will be explained with reference to FIGS. 10 to 13.

As shown in FIGS. 10 and 11, the bottom portion 2D of the rotating cup is connected to the spin-chuck 6 by means of the lock mechanism 10. To the upper peripheral edge portion of the bottom 2D, two depressed portions 10A are formed. On the other hand, to the lower surface of the spin-chuck 6, a projecting portion 10B is formed. When the projecting portion 10B is fitted in each of the depressed portions 10A as shown in FIG. 11, the rotating cup 2 can be rotated in synchronism with the spin-chuck 6 without failure.

Alternatively, a pair of projecting portions 10C are formed by partly projecting the upper bottom surface 2D of the rotating cup, as shown in FIG. 12 and the projecting portion 10E of the spin-chuck 6 may be fitted in a trench 10D formed between the pair of projecting portions 10C. In contrast, by forming a trench 10G on the spin-chuck 6 and a projecting portion 10F on the bottom portion 2D, the projecting portion 10F may be fitted in the trench 10G.

Hereinbelow, the spin-chuck sealing mechanism for sealing the rotating cup and spin-chuck liquidtight will be explained with reference to FIGS. 14 to 17.

In the case where a soft O ring made of rubber material is used as the spin-chuck sealing mechanism, the O ring is remained deformed and will be hardly returned to the original shape with the passage of time. As a result, a desired sealing performance will not be obtained. On the contrary, if the O ring having a high modules of elasticity in torsion is used, a pressure of 8 kg provided by conventional vertically movable means is not sufficient to deform the O ring uniformly. As a result, high sealing performance will not be obtained.

Figure 14:
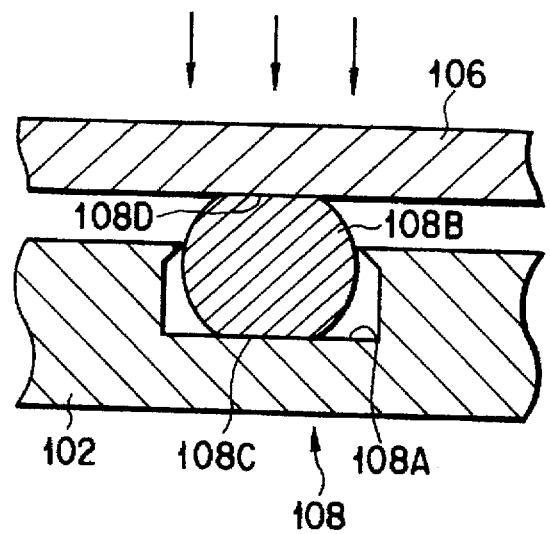
FIG. 14 is an enlarged cross-sectional view showing a conventional spin-chunk sealing portion.

As shown in FIG. 14, if the pressure is increased so as to increase contacting areas 108C and 108D of the O ring, the spin-chuck 106 and the rotating cup 102 will be deformed. As a result, a predetermined flatness cannot be obtained.

Figure 15:
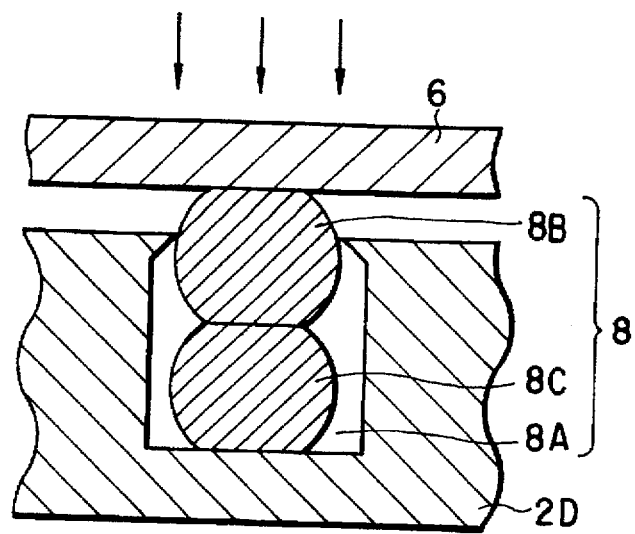
FIG. 15 is an enlarged cross-sectional view showing a spin-chunk sealing portion according to an embodiment of the present invention.

Alternatively, two rings 8B and 8C may be disposed one on top of the other in a trench 8A by making the trench 8A of the rotating cup 2 deeper, as shown in FIG. 15. Owing to this arrangement, the pressure causing deformation is dispersed in two double O rings 8B and 8C, so that a good sealing performance can be attained even if use is made of the O ring having a high modules of elasticity in torsion. Furthermore, three O rings 8B, 8C and 8D layered alternatively may be used by making the trench 8A of the rotating cup 2 further deeper, as shown in FIG. 16. Moreover, a hollow O ring 8E may be fitted in the trench 8A, as shown in FIG. 17.

Hereinbelow, operation of the resist coating apparatus constructed as mentioned above will be explained.

As shown in FIG. 18, a cover 4 is moved up and kept distance from a rotation cup 2. After a spin-chuck 6 is moved up, substrate S is transferred from a main arm 74 to the spin-chuck 6. The spin-chuck 6 holds substrate S by adsorption. Subsequently, the spin-chuck 6 is moved down and connected to the bottom portion of the rotating cup 2 via a lock mechanism 10. At this time, the spin-chuck 6 and the rotating cup 2 are sealed liquidtight by a sealing mechanism 8. Thereafter, a predetermined volume of resist solution R is poured dropwise from the upper nozzle 36 to a center portion of substrate S.

A motor 24 is then started to rotate a rotating collar 2C and a vertically movable axis 14 at the same rotation rate. Since the rotation cup 2 and the spin-chuck 6 are connected by the lock mechanism 10, they are rotated in a synchronized manner, thereby causing no difference in the rotation speed between them.

After coating, the resist solution is centrifugally separated from substrate S and discharged in a drain cup 50 by way of drainage holes 52A and 52B provided in the bottom peripheral edge and on the side periphery of the rotating cup 2. The resist solution collected in the drain cup 50 is discharged outside from a drain hole 54 provided at the bottom. Simultaneously, the drain cup 50 is evacuated by way of an exhaust passage 58. However, a mist-form liquid contained in the evacuation gas is captured or stopped by a filter 62 and barrier member 60, recondensed and discharged from the drain hole 54. When the filter 62 are clogged, a cleaning liquid is sprayed from the nozzle 64 on the filter 62.

In the aforementioned embodiments, the case is explained in which the resist coating apparatus of the present invention is installed in a resist treatment system for an LCD substrate. However, the resist coating apparatus of the present invention can be used alone.

Also in the embodiments, two belt-driving systems are particularly used as driving systems for rotation of the rotating cup 2 and spin-chuck 6. However, the present invention will not be limited to such driving systems. Any driving system can be used. In any case, there is no difference in a rotation speed since the rotation cup 2 and spin-chuck 6 are locked.

Furthermore, in the aforementioned embodiments, an apparatus for coating a resist solution on a glass substrate for LCD is explained as an example. However, the present invention will be used as an apparatus for applying an coating solution on a substrate such as a semiconductor wafer.

According to a first aspect of the present invention, a mist-form waste is condensed and liquefied by a gas-liquid separating member and discharged by way of a drain passage. When a filter is employed as the gas-liquid separating member, the clogging of the filter with deposited and dried resist will be removed by spraying a cleaning liquid from a cleaning nozzle.

According to a second aspect of the present invention, a lock mechanism is provided between a rotation cup and a spin-chuck, so that a difference in the rotation speed between them will be efficiently prevented.

According to a third aspect of the present invention, a plurality of sealing members are layered in the axis direction. Hence, even if the sealing member is extremely hard, the sealing performance between the rotating cup and spin-chuck can be ensured even by relatively weak pressure application.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. An apparatus for coating resist comprising:
 a spin-chuck which is vertically movable, said spin-chuck holding a substrate received and rotating together with said substrate,
 resist solution supplying means for supplying a resist solution onto said substrate held on the spin-chuck;
 a rotating cup surrounding the substrate held on said spin-chuck and being rotated in synchronism with said spin-chuck, for receiving said resist solution centrifugally separated from said substrate;
 a drain cup provided around said rotating cup, for receiving a waste material discharged from said rotating cup, said drain cup having a collecting space for collecting said waste material received;
 a drainage passage having a drainage port opening into said collecting space for discharging a liquid component of said waste material collected in said collecting space therefrom;
 an exhaust passage having an exhaust port communicating with said collecting space, for discharging a gas component of said waste material collected in said collecting space therefrom;
 an exhaust gas guiding passage provided at a level higher than at least said drainage port, for guiding said gas component from said collecting space to said exhaust passage; and
 a gas-liquid separating member provided in said exhaust gas guiding passage, for condensing a liquid component contained in an air flow containing said gas component by striking it against said gas-liquid separating member, thereby preventing said liquid component from going around said exhaust passage.

2. The apparatus for coating resist according to claim 1, wherein said gas-liquid separating member is an annular barrier member provided on a lower inner wall which substantially defines a flat portion of said exhaust gas guiding passage.

3. The apparatus for coating resist according to claim 1, wherein said gas-liquid separating member is an annular pipe member provided on a lower inner wall which substantially defines a flat portion of said exhaust gas guiding passage.

4. The apparatus for coating resist according to claim 1, wherein said gas-liquid separating member is a metal mesh filter provided on an entrance side of said exhaust gas guiding passage.

5. The apparatus for coating resist according to claim 4, further comprising nozzle means for spraying a cleaning liquid on said metal mesh filter.

6. The apparatus for coating resist according to claim 5, wherein said cleaning liquid contains at least a solvent of a resist solution.

7. The apparatus for coating resist according to claim 5, wherein said nozzle means sprays said cleaning liquid on said metal mesh filter after predetermined hours or each time predetermined lot numbers are treated.

8. The apparatus for coating resist according to claim 7, said nozzle means having an exhaust gas volume measuring means for measuring exhaust volume passing through said exhaust passage sprays said cleaning liquid on said metal mesh filter in accordance with a measured exhaust volume.

9. The apparatus for coating resist according to claim 1, further comprising nozzle means for spraying a cleaning liquid on an inner wall defining said exhaust gas guiding passage.

10. The apparatus for coating resist according to claim 1, further comprising nozzle means for spraying a cleaning liquid on an inner wall surrounding said collecting space.

11. The apparatus for coating resist according to claim 1, further comprising nozzle means spraying a cleaning liquid on the lower surface of said rotating cup.

12. The apparatus for coating resist according to claim 1, further comprising an annular barrier member provided in a clearance formed between an upper wall defining said exhaust gas guiding passage and a lower surface of said rotating cup.

13. The apparatus for coating resist according to claim 1, wherein said exhaust gas guiding passage and exhaust passage are provided within said drain cup.

14. The apparatus for coating resist according to claim 1, wherein said exhaust gas guiding passage and exhaust passage are provided outside said drain cup.

15. An apparatus for coating resist comprising:

a spin-chuck which is vertically movable, said spin-chuck holding a substrate received and rotating together with said substrate;

resist solution supplying means for supplying a resist solution onto a substrate held on said spin-chuck;

a rotating cup surrounding a substrate held on said spin-chuck and rotated in synchronism with said spin-chuck, for receiving said resist solution centrifugally separated from said substrate;

a drain cup provided around said rotating cup, for receiving a waste material discharged from said rotating cup, said drain cup having a collecting space for collecting said waste material received;

a drainage passage having a drainage port opening into said collecting space, for discharging a liquid component of said waste material collected in said collecting space therefrom;

an exhaust passage having an exhaust port communicating with said collecting space, for discharging a gas component of said waste material collected in said collecting space therefrom; and a lock mechanism for locking said rotating cup and said spin-chuck so as not to move individually.

16. An apparatus for coating resist comprising:

a spin-chuck which is vertically movable, said spin-chuck holding a substrate received and rotating together with said substrate;

resist solution supplying means for supplying a resist solution onto a substrate held on said spin-chuck;

a rotating cup surrounding a substrate held on said spin-chuck and rotated in synchronism with said spin-chuck, for receiving said resist solution centrifugally separated from said substrate;

a drain cup provided around said rotating cup, for receiving a waste material discharged from said rotating cup, said drain cup having a collecting space for collecting said waste material received;

a drainage passage having a drainage port opening into said collecting space for discharging a liquid component of said waste material collected in said collecting space therefrom;

an exhaust passage having an exhaust port communicating with said collecting space, for discharging a gas component of said waste material collected in said collecting space therefrom; and sealing means interposed between said rotating cup and said spin-chuck, said sealing means having a trench formed in at least one of said rotating cup and said spin-chuck, and having a plurality of O ring members layered in said trench.

* * * * *